(12) United States Patent
Ishige et al.

(10) Patent No.: US 9,929,531 B2
(45) Date of Patent: Mar. 27, 2018

(54) OPTICAL MODULE

(71) Applicant: FURUKAWA ELECTRIC CO., LTD., Tokyo (JP)

(72) Inventors: Yuta Ishige, Tokyo (JP); Naoki Hayamizu, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 325 days.

(21) Appl. No.: 14/937,060

(22) Filed: Nov. 10, 2015

(65) Prior Publication Data

US 2016/0064895 A1    Mar. 3, 2016

Related U.S. Application Data

(63) Continuation of application No. PCT/JP2014/064501, filed on May 30, 2014.

(30) Foreign Application Priority Data

May 30, 2013    (JP) .................................. 2013-114672

(51) Int. Cl.
*G02B 7/02*    (2006.01)
*H01S 5/022*    (2006.01)
(Continued)

(52) U.S. Cl.
CPC .......... *H01S 5/02252* (2013.01); *H01S 5/005* (2013.01); *H01S 5/0226* (2013.01);
(Continued)

(58) Field of Classification Search
CPC .. G02B 6/4239; G02B 7/025; G02B 19/0052; F21K 9/00; H01S 5/005; H01S 5/02248; H01S 5/02288; H01L 2224/48227
(Continued)

(56) References Cited

U.S. PATENT DOCUMENTS 7,279,723 B2    10/2007    Matsumura et al.
7,285,803 B2    10/2007    Kato et al.
(Continued)

FOREIGN PATENT DOCUMENTS

JP    7-147430    6/1995
JP    2001-116962    4/2001
(Continued)

OTHER PUBLICATIONS

International Search report dated Aug. 26, 2014 in PCT/JP2014/064501, filed on May 30, 2014 ( with English Translation).
(Continued)

*Primary Examiner* — Mahidere Sahle
(74) *Attorney, Agent, or Firm* — Oblon, McClelland, Maier & Neustadt, L.L.P.

(57) ABSTRACT

An optical module includes a base portion having a top-surface metal layer on a top surface of a base, a semiconductor element on the top-surface metal layer and an optical element optically-coupled to the semiconductor element and bonded to the base with adhesive at a first side surface of the base at a side of the optical element being optically-coupled. A pull-back area is formed on the top surface by disposing a second side surface at the side, of the top-surface metal layer at a retracted position to the first side surface at the side. Between an adhesion area where the base and the optical element are bonded and a mounting portion below an optical-power-outputting surface of the semiconductor element, the top-surface metal layer has an adhesive flow stopping portion formed, by patterning, so as to prevent the adhesive from flowing through the pull-back area to the mounting portion's side.

7 Claims, 5 Drawing Sheets

(51) Int. Cl.
   *H01S 5/00* (2006.01)
   *H01S 5/024* (2006.01)
(52) U.S. Cl.
   CPC ....... *H01S 5/02276* (2013.01); *H01S 5/02288* (2013.01); *H01S 5/02476* (2013.01)
(58) Field of Classification Search
   USPC .......................................... 359/811, 812, 815
   See application file for complete search history.

(56) References Cited

U.S. PATENT DOCUMENTS

| | | |
|---|---|---|
| 7,483,456 B2 | 1/2009 | Haensel et al. |
| 7,768,029 B2 | 8/2010 | Matsumura et al. |
| 2004/0151228 A1 | 8/2004 | Fuse |
| 2006/0109882 A1 | 5/2006 | Haensel et al. |
| 2011/0051454 A1 | 3/2011 | Wolf et al. |

FOREIGN PATENT DOCUMENTS

| | | |
|---|---|---|
| JP | 2002-359425 | 12/2002 |
| JP | 2004-87774 | 3/2004 |
| JP | 2004-87776 | 3/2004 |
| JP | 2004-214326 | 7/2004 |
| JP | 2005-57144 | 3/2005 |
| JP | 2005-347590 | 12/2005 |
| JP | 2008-53483 | 3/2008 |
| JP | 2009-239015 | 10/2009 |
| JP | 2010-278364 | 12/2010 |
| JP | 2011-513774 | 4/2011 |
| JP | 5075165 | 11/2012 |

OTHER PUBLICATIONS

Written Opinion dated Aug. 26, 2014 in PCT/JP2014/064501, filed on May 30, 2014.

OPTICAL MODULE

CROSS-REFERENCE TO RELATED APPLICATION

This application is a continuation of PCT International Application No. PCT/JP2014/064501 filed on May 30, 2014 which claims the benefit of priority from Japanese Patent Application No. 2013-114672 filed on May 30, 2013, the entire contents of which are incorporated herein by reference.

BACKGROUND OF THE INVENTION

1. Field of the Invention

The present invention relates to an optical module.

2. Description of the Related Art

As an optical module obtained by making a plurality of optical elements into one module, for example, a semiconductor laser module is disclosed (for example, Patent Literatures of Japanese Patent Application Laid-open Publication No. 2004-214326, Japanese Patent Application Laid-open Publication No. 2004-087776 and Japanese Patent Application Laid-open Publication No. 2004-087774). Semiconductor laser modules disclosed by These Patent Literatures have a structure in which a lens coupled to a semiconductor laser element optically is bonded, and fixed with resin adhesive, onto a base on which the semiconductor laser element is mounted.

If the adhesive bonding and fixing the lens flows into a laser-light-emitting end side of the semiconductor laser element and enters an optical coupling path, there are problems such as breakage of the semiconductor laser element, attenuation of intensity of the laser light output via the lens, and deterioration, such as damage by burn, of adhesive by the energy of the laser light. To address this problem, Patent Literatures 1 to 3 disclose solutions of disposing a notch between an adhesion area and the semiconductor laser element, and positioning the adhesion area on both of side surfaces of the semiconductor laser element.

SUMMARY OF THE INVENTION

It is an object of the present invention to at least partially solve the problems in the conventional technology.

In accordance with one aspect of the present invention, an optical module includes: a base portion having a base and a top-surface metal layer formed on a top surface of the base; a semiconductor element mounted on the top-surface metal layer of the base portion; and an optical element coupled to the semiconductor element optically. The optical element is bonded to the base with adhesive at a first side surface of the base at a side where the optical element is coupled to the semiconductor element optically. A pull-back area is formed on the top surface of the base by disposing a second side surface, at the side where the optical element is coupled to the semiconductor element optically, of the top-surface metal layer at a retracted position relative to the first side surface of the base at the side where the optical element is coupled to the semiconductor element optically. Between an adhesion area where the base and the optical element are bonded and a mounting portion positioned below an optical-power-outputting surface of the semiconductor element, the top-surface metal layer has an adhesive flow stopping portion formed, by patterning, so as to prevent the adhesive from flowing through the pull-back area to the mounting portion's side.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
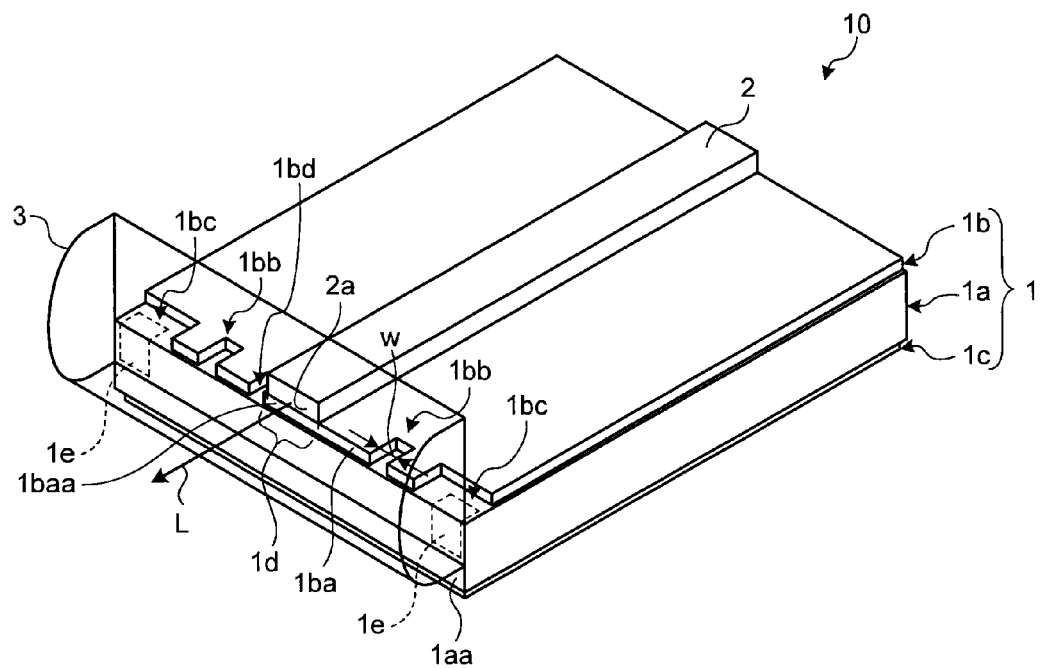
FIG. 1 is a schematic perspective view of a semiconductor laser module according to Embodiment 1.

Hereafter, embodiments of an optical module according to embodiments of the present invention will be explained with reference to the drawings. The embodiments do not limit the present invention. In all the drawings, identical or corresponding elements are given same reference numerals. It should be noted that the drawings show schematic examples. Accordingly, a relationship between respective elements may be different from real values. Among the drawings, there may be parts where the relationships and ratios of the shown sizes are different from one another.

As described above, adhesive entering an optical coupling path between two adjacent optical elements causes a problem of attenuation in optical intensity and deterioration of adhesive.

In contrast, according to the embodiment described below, an optical module in which adhesive is prevented from entering an optical coupling path is provided.

Embodiment 1

Figure 2:
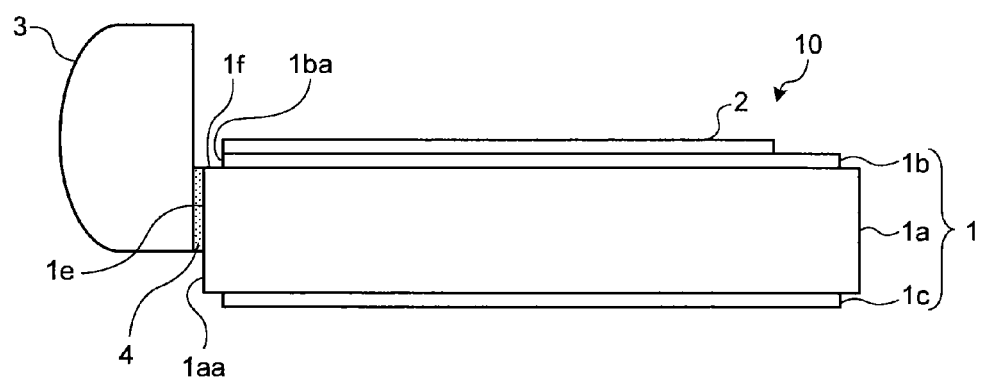
FIG. 2 is a side view of the semiconductor laser module shown in FIG. 1.

FIG. 1 is a schematic perspective view of a semiconductor laser module according to Embodiment 1 of the present invention. FIG. 2 is a side view of the semiconductor laser module shown in FIG. 1. As shown in FIGS. 1 and 2, a semiconductor laser module 10 includes a base portion 1, a semiconductor laser element 2 as a semiconductor element, and a cylindrical lens 3 as an optical element. The cylindrical lens 3 shown in FIG. 1 is transparent.

The base portion 1 has a base 1a, and a top-surface metal layer 1b and a back-surface metal layer 1c formed on a top surface and a back surface facing thereto of the base 1a respectively.

The base 1a is made of, for example, aluminum nitride (AlN) of which thermal conductivity is as high as 170

W/m·K for radiating heat produced when operating the semiconductor laser element 2. The base 1*a* may be made of other material such as alumina, glass, and silicon.

The top-surface metal layer 1*b* and the back-surface metal layer 1*c* are metallization layers or a plating layer made of, for example, copper (Cu), and are used for wiring to the semiconductor laser element 2 or cementing the semiconductor laser element 2 by soldering. As will be described later, the top-surface metal layer 1*b* and the back-surface metal layer 1*c* are used for adjusting a thermal expansion coefficient of the base portion 1.

The semiconductor laser element 2 is mounted on the top-surface metal layer 1*b* and in a mounting area 1*d* of the base portion 1. More specifically, the semiconductor laser element 2 of which back surface is coated with aurum (Au) plating or the like is cemented on the top-surface metal layer 1*b* with solder such as aurum (Au)-tin (Sn). When being supplied with driving current from a power supply device not shown in the drawings, the semiconductor laser element 2 produces, at its active layer portion, a laser light L at a wavelength included in wavelength band of 980 nm, wavelength band of 1480 nm, wavelength band of 1550 nm or the like used in a field of optical communication, for example, and then outputs the produced laser light L from an optical-power-outputting surface 2*a*.

A portion of a side surface 1*ba* of the top-surface metal layer 1*b*, positioned below the optical-power-outputting surface 2*a*, is referred to as a mounting portion 1*baa*.

The top-surface metal layer 1*b* has an insulation groove 1*bd* formed adjacent to the semiconductor laser element 2. The insulation groove 1*bd* is formed so as to divide the top-surface metal layer 1*b* into two portions along the semiconductor laser element 2. The insulation groove 1*bd* is a groove for insulating both portions of the top-surface metal layer 1*b* when arranging an electric wiring from both of the two portions of the top-surface metal layer 1*b* at both sides of the semiconductor laser element 2 to the semiconductor laser element 2 with wires.

The cylindrical lens 3 is bonded with the adhesive 4 to two adhesion areas 1*e* extending to an upper surface of the base 1*a* from a side surface 1*aa* that is on the same side as that of the optical-power-outputting surface 2*a* of the semiconductor laser element 2. The cylindrical lens 3, optically coupled to the semiconductor laser element 2 at the side of the side surface 1*aa*, condenses or collimates the laser light L outputted from the semiconductor laser element 2 into an approximate circular beam shape and makes the laser light L couple optically with an optical element such as an optical not shown in the drawings.

The adhesive 4 is, for example, epoxy resin, acrylic resin, urethane resin, Silicone resin or the like. For its curability, the adhesive 4 is UV-curable, visible-light-curable, thermosetting, hybrid-curable by ultraviolet ray and heat, and hybrid-curable by visible light and heat or the like, but not limited thereto.

A pull-back area 1*f* is formed on the base 1*a*. The pull-back area 1*f* is of a shelf-like form on the top surface of the base 1*a* by disposing the side surface 1*ba* of the top-surface metal layer 1*b* at a position retracted from the side surface 1*aa*, at a side where the semiconductor laser element 2 is coupled to the cylindrical lens 3 optically, of the base 1*a*. Such a pull-back area is formed not only at the side of the side surface 1*aa* but also at each side surface of the base 1*a*. The pull-back area as such corresponds to a cutting margin for preventing a burr from being produced at a metal layer when cutting a metal layer, formed on the base 1*a* by metallization or plating, into desirable size of chips. A width of the pull-back area 1*f* is, for example, 10 μm to 50 μm.

The top-surface metal layer 1*b* has two notched portions 1*bc* at portions corresponding to the adhesion areas 1*e* on the upper surface of the base 1*a*. The notched portions 1*bc* are areas in which the side surface 1*ba* of the top-surface metal layer 1*b* is retracted from the pull-back area 1*f* to a large degree. The adhesion area 1*e* extends to the top surface, exposed by the existence of the notched portions 1*bc*, of the base 1*a*. The existence of the notched portion 1*bc* helps enabling extension of the adhesion area 1*e* to the top surface of the base 1*a*. As a result, the bonding strength for the cylindrical lens 3 to the base 1*a* can be increased since the cylindrical lens 3 can be bonded with, and fixed to, the side surface 1*aa* and the top surface of the base 1*a*.

Herein the top-surface metal layer 1*b* has an adhesive flow stopping portion 1*bb* formed between the adhesion area 1*e* and the mounting portion 1*baa*, by patterning so as to prevent the adhesive 4 from flowing to the side of the mounting portion 1*baa* across the pull-back area 1*f*. The adhesive flow stopping portion 1*bb* is configured by a notch of which retraction degree is greater than that of the pull-back area 1*f* relative to the side surface 1*aa* of the base 1*a*. From a view point of preventing the flow of the adhesive 4, it is preferable that the width W of the adhesive flow stopping portion 1*bb* be equal to or wider than a width (retraction degree) of the pull-back area 1*f*.

A function of the adhesive flow stopping portion 1*bb* will be explained. For example, the semiconductor laser module 10 as such is produced as follows. At first, the position of the cylindrical lens 3 is adjusted so that the optical coupling of the cylindrical lens 3 to the semiconductor laser element 2 is in an adequate state when the laser light L is outputted from the semiconductor laser element 2 mounted on the base portion 1. The cylindrical lens 3 is moved temporarily from the adjusted position, and then the adhesive 4 is applied to the adhesion area 1*e*. Then the cylindrical lens 3 is attached to the base portion 1 via the adhesive 4, and the position of the cylindrical lens 3 is fine-tuned. After that, the cylindrical lens 3 is bonded on, and fixed to, the base portion 1 by curing the adhesive 4.

Figure 3:
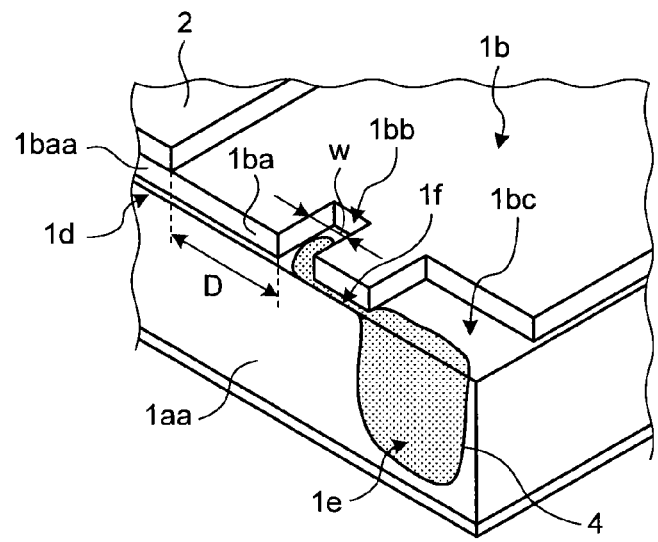
FIG. 3 is a view for explaining a function of an adhesive flow stopping portion.

FIG. 3 is a view for explaining a function of the adhesive flow stopping portion 1*bb*. After applying the adhesive 4 to the above-described adhesion area 1*e*, the adhesive 4 overflowing from the adhesion area 1*e* and having fluidity moves on the pull-back area 1*f* sometimes by capillary phenomenon as shown in FIG. 3. However, since the adhesive flow stopping portion 1*bb* configured by the notch is present between the adhesion area 1*e* and the mounting portion 1*baa*, the capillary force is blocked by the adhesive flow stopping portion 1*bb*, and thus, the adhesive 4 is prevented from moving to the mounting portion 1*baa*'s side across the adhesive flow stopping portion 1*bb*. As a result, the adhesive 4 is prevented from entering the optical coupling path between the semiconductor laser element 2 and the cylindrical lens 3, and thus helps efficient assembly of the semiconductor laser module 10.

Since the adhesive flow stopping portion 1*bb* as such can be formed easily by merely changing a pattern for forming the top-surface metal layer 1*b* and since the adhesive flow stopping portion 1*bb* makes use of the existing top-surface metal layer 1*b*, a flow stopping for the adhesive 4 can be achieved easily at low cost and without requiring additional configuration. In addition, the effect achieved by the adhesive flow stopping portion 1*bb* helps using the adhesive 4 of relatively low viscosity. Moreover, since thickness of the adhesive 4 at two adhesion areas 1*e* can be adjusted to be equal by setting a shape and a position of the adhesive flow stopping portion 1bb, the cylindrical lens 3 is bonded and fixed with fewer inclination and position gap of an optical axis at a more precise arrangement.

It is preferable that the thickness of the top-surface metal layer 1b be equal to or greater than 10 μm to obtain the effect of flow stopping by the adhesive flow stopping portion 1bb.

Moreover, it is preferable that the adhesive flow stopping portion 1bb be separated from the optical-power-outputting surface 2a of the semiconductor laser element 2 to some extent, and in order to prevent the adhesive 4 from entering the optical coupling path, it is preferable that a distance D between the adhesive flow stopping portion 1bb and the mounting portion 1baa be equal to or greater than 100 μm, and it is more preferable that the distance D be equal to or greater than 500 μm. Herein the distance D between the adhesive flow stopping portion 1bb and the mounting portion 1baa is a distance between a position of the top-surface metal layer 1b corresponding to a side wall of the optical-power-outputting surface 2a and a side wall, closer to the mounting portion 1baa, of the adhesive flow stopping portion 1bb.

As explained above, the semiconductor laser module 10 according to the present embodiment 1 is configured to prevent the adhesive 4 from entering the optical coupling path between the semiconductor laser element 2 and the cylindrical lens 3.

Embodiment 2

Figure 4:
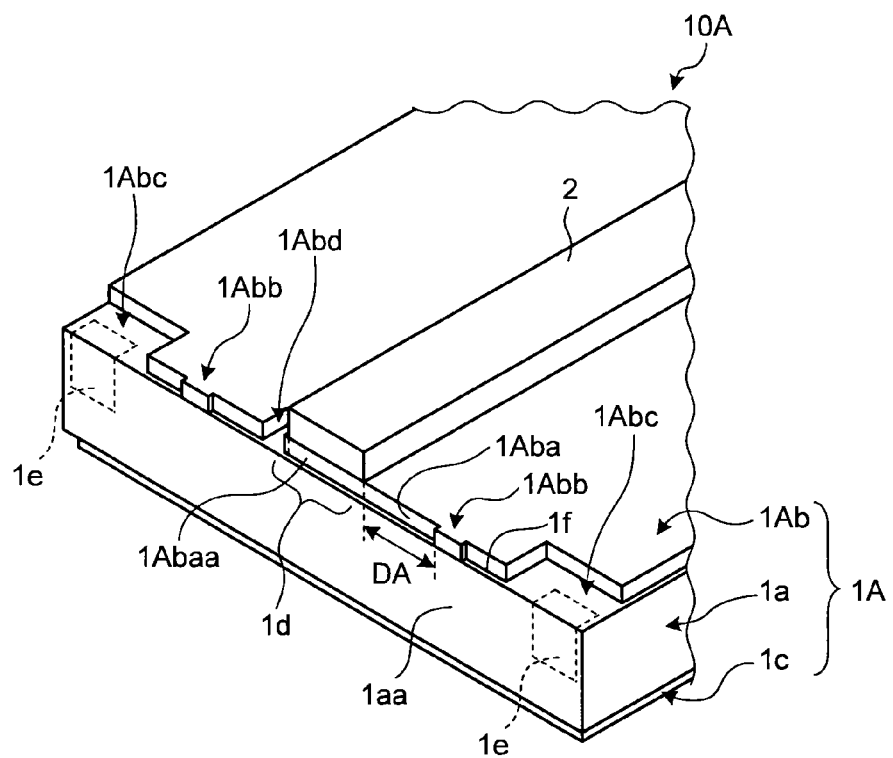
FIG. 4 is a schematic perspective view of an essential part of a semiconductor laser module according to Embodiment 2.

FIG. 4 is a schematic perspective view of an essential part of a semiconductor laser module according to Embodiment 2 of the present invention. As shown in FIG. 4, a semiconductor laser module 10A has a configuration in which the base portion 1 of the semiconductor laser module 10 according to Embodiment 1 shown in FIG. 1 is replaced with a base portion 1A. The base portion 1A has a configuration in which the top-surface metal layer 1b of the base portion 1 is replaced with a top-surface metal layer 1Ab. FIG. 4 does not illustrate the cylindrical lens 3.

The pull-back area 1f is formed between a side surface 1aa of the base 1a and a side surface 1Aba of the top-surface metal layer 1Ab. The top-surface metal layer 1Ab has an adhesive flow stopping portion 1Abb configured by a protrusion portion formed so as to block the pull-back area 1f. The top-surface metal layer 1Ab has a notched portion 1Abc and an insulation groove 1Abd that are configured similarly to the notched portion 1bc and the insulation groove 1bd of the top-surface metal layer 1b.

As described above, since the pull-back area 1f is blocked by the adhesive flow stopping portion 1Abb disposed between the adhesion area 1e for the adhesive 4 and the mounting portion 1Abaa of the semiconductor laser element 2, the adhesive 4 is prevented from moving to the mounting portion 1Abaa's side over the adhesive flow stopping portion 1Abb. As a result, the adhesive 4 is prevented from entering the optical coupling path between the semiconductor laser element 2 and the cylindrical lens 3. It is preferable that a distance DA between the adhesive flow stopping portion 1Abb and the mounting portion 1Abaa be equal to or greater than 100 μm, and it is more preferable that the distance DA be equal to or greater than 500 μm.

Embodiment 3

Figure 5:
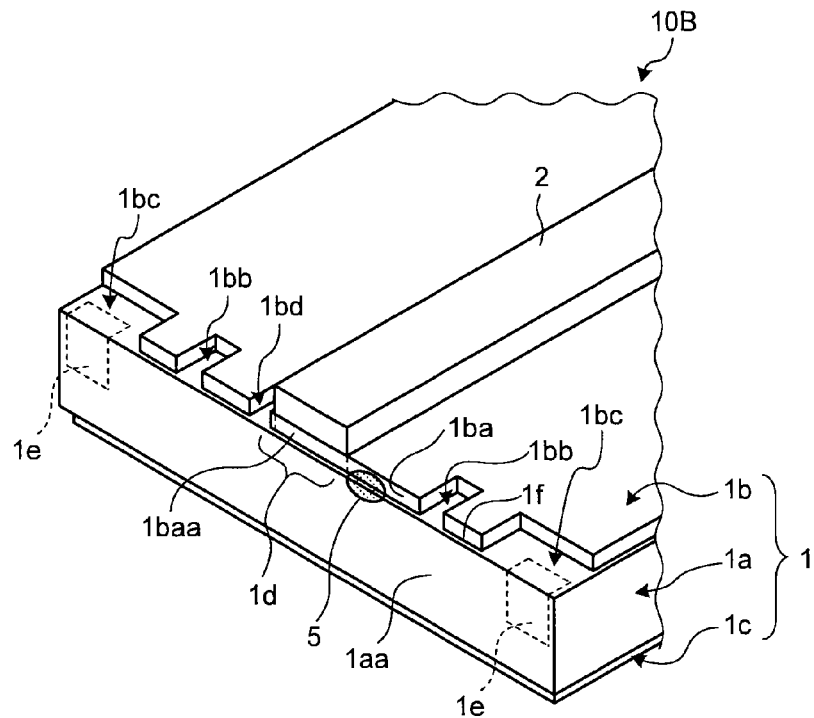
FIG. 5 is a schematic perspective view of an essential part of a semiconductor laser module according to Embodiment 3.

FIG. 5 is a schematic perspective view of an essential part of a semiconductor laser module according to Embodiment 3 of the present invention. As shown in FIG. 5, a semiconductor laser module 10B has a configuration in which a blocking member 5 is further added to the configuration of the semiconductor laser module 10 according to Embodiment 1 shown in FIG. 1. FIG. 5 does not illustrate the cylindrical lens 3.

The blocking member 5 is disposed between the mounting portion 1baa and the adhesive flow stopping portion 1bb of the semiconductor laser element 2 and is formed to block the pull-back area 1f. The blocking member 5 as such is achieved by, for example, cured resin adhesive, highly viscous oil or the like.

Even if the adhesive 4 overflows from the adhesive flow stopping portion 1bb to move to the mounting area 1d's side, the blocking member 5 provided as such prevents the adhesive 4 from reaching the mounting portion 1baa.

The blocking member 5 as such may be applied to the semiconductor laser module 10A according to Embodiment 2 shown in FIG. 4.

By the way, as described above, the top-surface metal layer 1b and the back-surface metal layer 1c formed on the each surface of the base 1a are used for adjusting the thermal expansion coefficient of the base portion 1 (for example, see Japanese Patent No. 5075165).

Herein a Von Mises Stress applied to the semiconductor laser element 2 was calculated when the thickness of the base 1a and the thicknesses of the top-surface metal layer 1b and the back-surface metal layer 1c were changed in the configuration of the semiconductor laser module 10 in the configuration according to the above-described embodiment 1. A state of mounting the semiconductor laser element 2 is not limited to junction-down. The base 1a was made of AlN, the top-surface metal layer 1b and the back-surface metal layer 1c were made of Cu, and the semiconductor laser element 2 was made of GaAs-based semiconductor material. Linear expansion coefficients of materials are $4.5 \times 10^{-6}$ (1/K) for AlN, $7.0 \times 10^{-6}$ (1/K) for Cu, and $5.9 \times 10^{-6}$ (1/K) for GaAs. The thickness of the base 1a was 0.3 mm, 0.5 mm, 0.7 mm, 1.0 mm, or 1.5 mm. The top-surface metal layer 1b and the back-surface metal layer 1c were identical in thickness such as 10 μm, 35 μm, 55 μm, 75 μm, or 100 μm. The adhesive flow stopping portion 1bb was separated from the semiconductor laser element 2 by equal to or greater than 500 μm. This prevents the structure of the adhesive flow stopping portion 1bb from affecting the Von Mises Stress applied to the semiconductor laser element 2.

Figure 6:
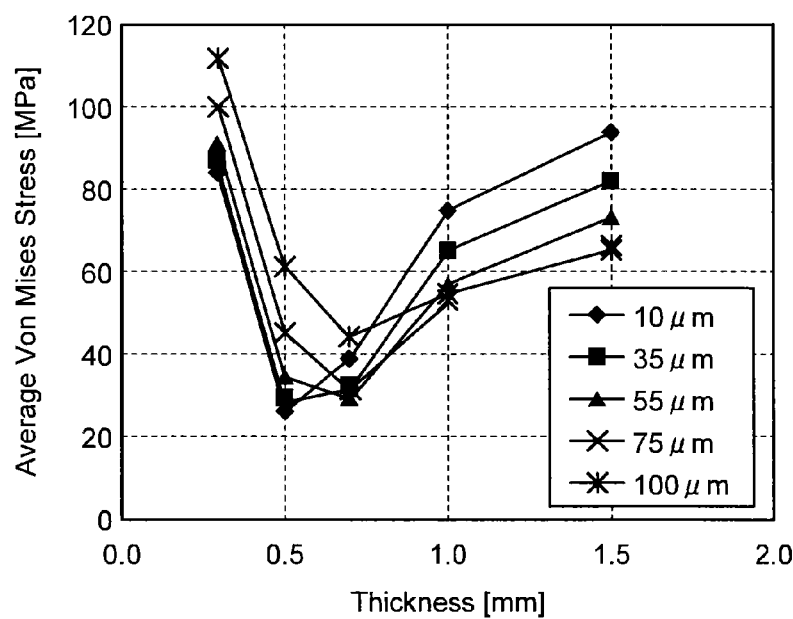
FIG. 6 is a view showing a relationship between thickness and stress of a base when thicknesses of top-and-back surface metal layers are changed.

FIG. 6 is a view showing a relationship between thickness and stress of a base when thicknesses of top-and-back surface metal layers are changed. A horizontal axis indicates the thickness of the base, and a vertical axis indicates average Von Mises Stress in a longitudinal direction on the center axis of the active layer portion of the semiconductor laser element 2.

As shown in FIG. 6, stress decreased within a range of 0.5 mm to 0.7 mm of the thickness of the base 1a at any thicknesses of the top-surface metal layer 1b and the back-surface metal layer 1c. Specifically, the linear expansion coefficient of the base 1a on the top surface of the top-surface metal layer 1b was $6.3 \times 10^{-6}$ (1/K) in a case 1) where the thickness of the base was 0.5 mm and the thicknesses of the top-and-back surface metal layers were 10 μm or 2) where the thickness of the base was 0.7 mm and the thicknesses of the top-and-back surface metal layers were 55 μm. The difference between this value and a value of linear expansion coefficient for GaAs-based semiconductor material forming the semiconductor laser element 2 is as extremely small as $0.4 \times 10^{-6}$ (1/K).

In a case shown in FIG. 6, an average Von Mises Stress was 111 MPa, greater than 100 MPa, when the thickness of the base was 0.3 mm and thicknesses of the top-and-back surface metal layers were 100 μm. In this state, a linear expansion coefficient difference between the base portion 1 and the semiconductor laser element 2 was approximately 2.5 ppm (1/K). By contrast, in any other conditions, average Von Mises Stresses were lower than 100 MPa and linear expansion coefficient differences were equal to or lower than 2 ppm (1/K).

The linear expansion coefficient difference between the base portion 1 and the semiconductor laser element 2 exceeding 2 ppm (1/K) may possibly cause a failure such as a crack or the like on the semiconductor laser element 2. Therefore, it is preferable that the thicknesses of the top-surface metal layer 1b and the back-surface metal layer 1c be set so that the linear expansion coefficient difference between the base portion 1 and the semiconductor laser element 2 is equal to or lower than 2 ppm/K. The thicknesses of the top-surface metal layer 1b and the back-surface metal layer 1c may not be necessarily identical, and the linear expansion coefficient difference between the base portion 1 and the semiconductor laser element 2 may be equal to or lower than 2 ppm/K. From a view point of restraining warp of the base portion 1, it is desirable that the thicknesses of the top-surface metal layer 1b and the back-surface metal layer 1c be identical.

Embodiment 4

Figure 7:
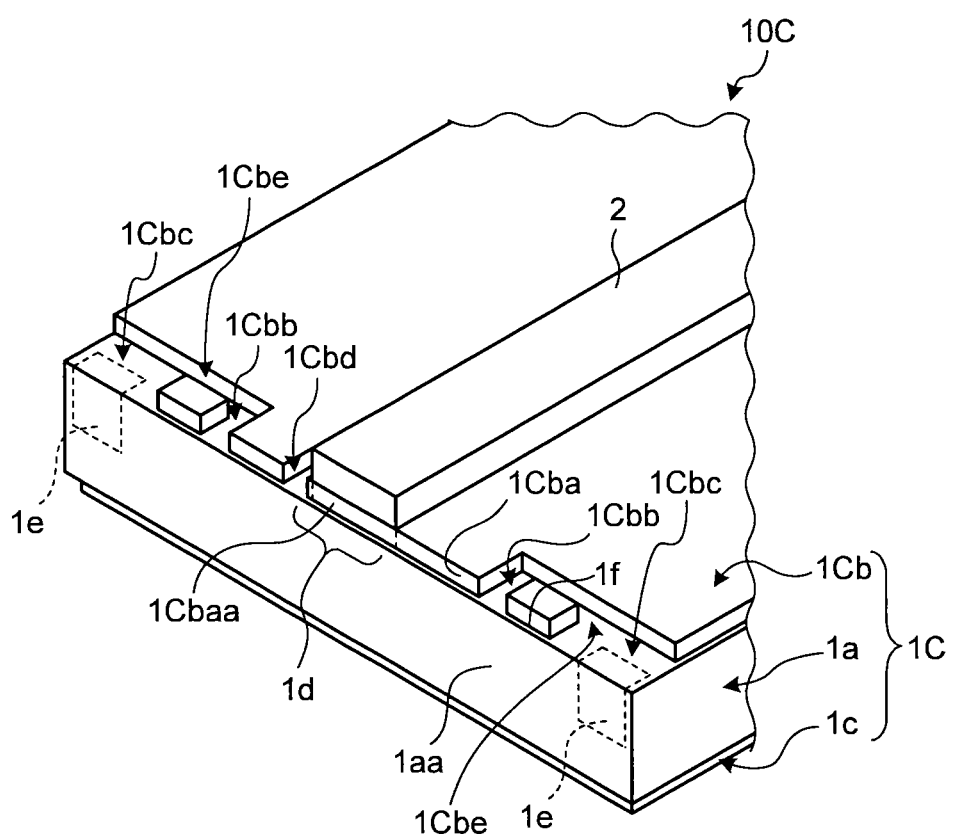
FIG. 7 is a schematic perspective view of an essential part of a semiconductor laser module according to Embodiment 4.

FIG. 7 is a schematic perspective view of an essential part of a semiconductor laser module according to Embodiment 4. As shown in FIG. 7, a semiconductor laser module 10C has a configuration in which the base portion 1 in the configuration of the semiconductor laser module 10 according to Embodiment 1 illustrated in FIG. 1 is replaced with a base portion 1C. The base portion 1C has a configuration in which the top-surface metal layer 1b is replaced with a top-surface metal layer 1Cb in the base portion 1. FIG. 4 does not illustrate the cylindrical lens 3.

The pull-back area 1f is formed between the side surface 1aa of the base 1a and a side surface 1Cba of the top-surface metal layer 1Cb. The top-surface metal layer 1Cb has a mounting portion 1Cbaa, an adhesive flow stopping portion 1Cbb, a notched portion 1Cbc, and an insulation groove 1Cbd, that are of similar configurations to those of the mounting portion 1baa, the adhesive flow stopping portion 1bb, the notched portion 1bc, and the insulation groove 1db of the top-surface metal layer 1b.

In the top-surface metal layer 1Cb, the adhesive flow stopping portion 1Cbb and the notched portion 1Cbc communicate through a groove 1Cbe. As described above, the adhesive flow stopping portion 1Cbb and the notched portion 1Cbc may communicate through the groove 1Cbe that is other than the pull-back area 1f as such. In the semiconductor laser module 10C as well, the adhesive flow stopping portion 1Cbb prevents the adhesive 4 from moving to the mounting portion 1Cbaa's side across the adhesive flow stopping portion 1Cbb, and therefore, the amount of adhesive 4 to be applied can be controlled precisely, thus variations in the contraction amount of cured adhesive can be decreased.

Embodiment 5

Figure 8:
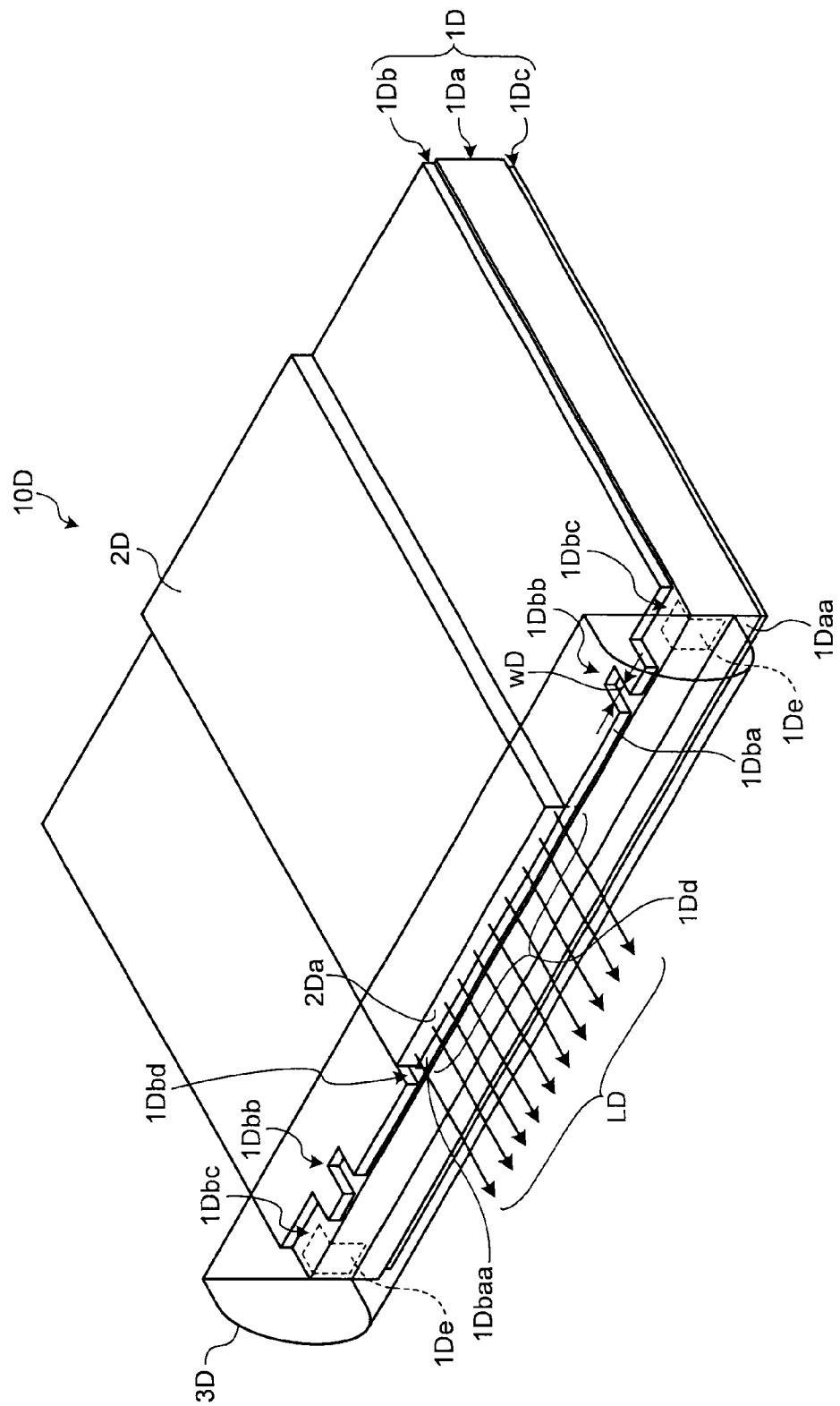
FIG. 8 is a schematic perspective view of a semiconductor laser module according to Embodiment 5.

FIG. 8 is a schematic perspective view of a semiconductor laser module according to Embodiment 5 of the present invention. AS shown in FIG. 8, a semiconductor laser module 10D includes a base portion 1D, a semiconductor laser element 2D, and a cylindrical lens 3D. The base portion 1D has a base 1Da, and a top-surface metal layer 1Db and a back-surface metal layer 1Dc formed on a top surface and a back surface facing to the top surface of the base 1Da respectively. The base 1Da has two adhesion areas 1De expanding from a side surface 1Daa to a top surface for bonding the cylindrical lens 3D. The cylindrical lens 3D is bonded with adhesive at the two adhesion areas 1De. Moreover, a pull-back area 1Df is formed on the base 1Da. The top-surface metal layer 1Db has an insulation groove 1Dbd, and has a mounting portion 1Dbaa at a side surface 1Dba. In addition, the top-surface metal layer 1Db has two notched portions 1Dbc and an adhesive flow stopping portion 1Dbb having a width WD. These elements constituting the semiconductor laser module 10D are similar to corresponding elements of the semiconductor laser module 10.

The semiconductor laser element 2D is mounted on the top-surface metal layer 1Db at the mounting area 1Dd of the base portion 1D, and cemented on the top-surface metal layer 1Db by soldering. Herein the semiconductor laser element 2D is a multi-emitting semiconductor laser element. When being supplied a driving current from a power supply device not shown in the drawings, the semiconductor laser element 2D produces, at an active layer portion, a laser light LD at a wavelength included in a wavelength band of 980 nm, a wavelength band of 1480 nm, a wavelength band of 1550 nm or the like for use in a field of communication, for example, and outputs the produced laser light LD from multiple light-emitting points on the optical-power-outputting surface 2Da. It is required that an optical element such as a cylindrical lens be fixed to the semiconductor laser element more precisely in the semiconductor laser module provided with the multi-emitting semiconductor laser element as such. In the semiconductor laser module 10D, the adhesive flow stopping portion 1Dbb prevents the adhesive from moving to the mounting portion 1Dbaa's side across the adhesive flow stopping portion 1Dbb, the amount of adhesive to be applied is controlled precisely, and variations in the contraction amount of cured adhesive can be decreased. Therefore, the semiconductor laser module 10D is of a configuration suitable for the multi-emitting semiconductor laser element 2D.

In the above-described embodiments, although the semiconductor element is a semiconductor laser element and the optical element is a cylindrical lens, the semiconductor element and the optical element may be elements of other types. For example, the semiconductor element may be a semiconductor light-emitting element such as an LED or a light-receiving element or the like. The optical element may be an element to be coupled with the semiconductor element optically, for example, other light-condensing element such as a rod lens, a prism, a beam splitter or the like.

The above-described embodiments do not limit the present invention. The present invention includes a configuration appropriately combining the above-described elements. Further effects or modification examples can be derived by an ordinary skilled person in the art easily. Therefore, further wide aspects of the present invention are not limited to the specific, detailed, and various modifications may be made.

INDUSTRIAL APPLICABILITY

As described above, the optical module according to the present invention is suitable for use in, for example, optical communication.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical module comprising:
a base portion having a base and a top-surface metal layer formed on a top surface of the base;
a semiconductor element mounted on the top-surface metal layer of the base portion; and
an optical element coupled to the semiconductor element optically, wherein
the optical element is bonded to the base with adhesive at a first side surface of the base at a side where the optical element is coupled to the semiconductor element optically,
a pull-back area is formed on the top surface of the base by disposing a second side surface, at the side where the optical element is coupled to the semiconductor element optically, of the top-surface metal layer at a retracted position relative to the first side surface of the base at the side where the optical element is coupled to the semiconductor element optically, and
between an adhesion area where the base and the optical element are bonded and a mounting portion positioned below an optical-power-outputting surface of the semiconductor element, the top-surface metal layer has an adhesive flow stopping portion formed, by patterning, so as to prevent the adhesive from flowing through the pull-back area to the mounting portion's side.

2. The optical module according to claim 1, wherein the adhesive flow stopping portion comprises a notch which is more retracted from the first side surface of the base than the pull-back area is.

3. The optical module according to claim 1, wherein the adhesive flow stopping portion comprises a protrusion portion formed so as to block the pull-back area.

4. The optical module according to claim 1, wherein a blocking member formed to block the pull-back area is disposed between the mounting portion and the adhesive flow stopping portion.

5. The optical module according to claim 1, wherein the adhesive flow stopping portion is separated from the semiconductor element by equal to or greater than 100 µm.

6. The optical module according to claim 1, wherein a thickness of the top-surface metal layer is equal to or greater than 10 µm.

7. The optical module according to claim 1, wherein
the base portion further has a back-surface metal layer formed at a back surface facing the top surface of the base, and
a thickness of the top-surface metal layer and a thickness of the back-surface metal layer are set so that a linear expansion coefficient difference between the base portion and the semiconductor element is equal to or lower than 2 ppm/K.

* * * * *